(12) United States Patent
Wittenberg et al.

(10) Patent No.: US 11,602,062 B2
(45) Date of Patent: Mar. 7, 2023

(54) ELECTRONIC DEVICES HAVING SLIDING EXPANDABLE DISPLAYS

(71) Applicant: Apple Inc., Cupertino, CA (US)

(72) Inventors: Michael B. Wittenberg, San Francisco, CA (US); Owen D. Hale, Oakland, CA (US); Tatsuya Sano, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/349,050

(22) Filed: Jun. 16, 2021

(65) Prior Publication Data

US 2021/0315113 A1 Oct. 7, 2021

Related U.S. Application Data

(63) Continuation of application No. 16/744,564, filed on Jan. 16, 2020, now Pat. No. 11,071,218.

(60) Provisional application No. 62/832,217, filed on Apr. 10, 2019.

(51) Int. Cl.
| | | |
|---|---|---|
| H05K 5/02 | (2006.01) | |
| H05K 5/00 | (2006.01) | |
| H01L 51/00 | (2006.01) | |
| H01L 51/52 | (2006.01) | |
| H01L 27/32 | (2006.01) | |

(52) U.S. Cl.
CPC ....... *H05K 5/0217* (2013.01); *H01L 27/3244* (2013.01); *H01L 51/0097* (2013.01); *H01L 51/5237* (2013.01); *H05K 5/0017* (2013.01); *H01L 2251/5338* (2013.01)

(58) Field of Classification Search
USPC ............... 361/807, 727, 728, 756, 809, 810
See application file for complete search history.

(56) References Cited

U.S. PATENT DOCUMENTS

| | | |
|---|---|---|
| 7,136,688 B2 | 11/2006 | Jung et al. |
| 7,388,578 B2 | 6/2008 | Tao |
| 10,082,833 B2 | 9/2018 | Chen |
| 10,868,897 B2 | 12/2020 | Cha et al. |
| 2006/0082518 A1 | 4/2006 | Ram |
| 2012/0002360 A1 | 1/2012 | Seo et al. |
| 2012/0280924 A1 | 11/2012 | Kummer et al. |
| 2012/0314400 A1 | 12/2012 | Bohn et al. |
| 2013/0058063 A1 | 3/2013 | O'Brien |
| 2014/0092566 A1 | 4/2014 | Shirasaka et al. |

(Continued)

*Primary Examiner* — Hung S. Bui
(74) *Attorney, Agent, or Firm* — Treyz Law Group, P.C.; G. Victor Treyz; David K. Cole

(57) ABSTRACT

An electronic device may have a housing with portions that slide relative to each other. A display may be supported on a surface of the housing such as on a front face of the housing. The housing portions may slide between an unexpanded state in which the display has an unexpanded viewable area on the front face and an expanded state in which the display has an expanded viewable area on the front face that is greater than the unexpanded viewable area. The housing portions may have interior regions that contain electrical components. The display may be formed from a flexible display substrate. A portion of a flexible display may be stored in an interior region of the housing when the housing is in the unexpanded state. In the unexpanded state, the flexible display may have one or more bends and may double back on itself one or more times.

20 Claims, 18 Drawing Sheets

(56) References Cited

U.S. PATENT DOCUMENTS

| | | |
|---|---|---|
| 2016/0216737 A1 | 7/2016 | Hayk et al. |
| 2017/0357287 A1 | 12/2017 | Yang |
| 2018/0077808 A1 | 3/2018 | Seo et al. |
| 2018/0102072 A1 | 4/2018 | Lee et al. |
| 2018/0138442 A1 | 5/2018 | Kim |
| 2018/0188778 A1 | 7/2018 | Shin |
| 2021/0306446 A1* | 9/2021 | Choi ................... H04M 1/0268 |
| 2022/0166865 A1* | 5/2022 | Seol ..................... G06F 1/1624 |

* cited by examiner

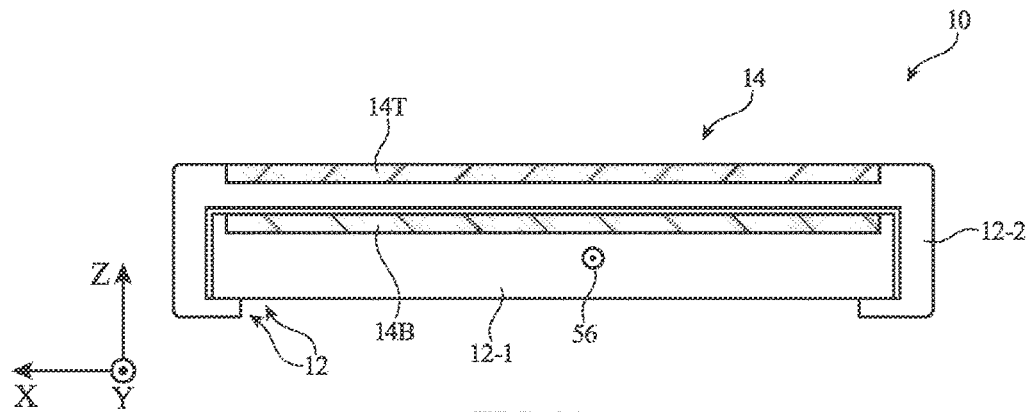
FIG. 32
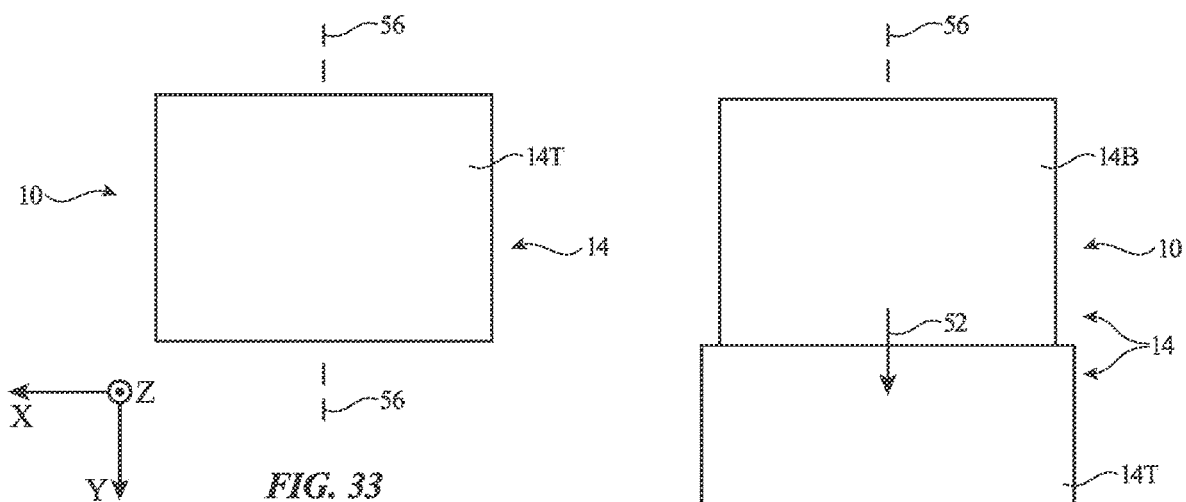
FIG. 33
FIG. 34

ELECTRONIC DEVICES HAVING SLIDING EXPANDABLE DISPLAYS

This application is a continuation of patent application Ser. No. 16/744,564, filed Jan. 16, 2020, which claims the benefit of provisional patent application No. 62/832,217, filed Apr. 10, 2019, which are hereby incorporated by reference herein in their entireties.

FIELD

This relates generally to electronic devices, and, more particularly, to electronic devices with displays.

BACKGROUND

Electronic devices often include displays. A touch screen display may be used in a cellular telephone or other portable device to display information for a user and to gather user input.

If care is not taken, a display may not offer sufficient screen real estate to display information of interest to a user. At the same time, it can be difficult to enlarge the size of electronic devices too much to accommodate larger displays, because this can make devices too bulky.

SUMMARY

An electronic device may have a display mounted in a housing. The housing may have portions that slide relative to each other. When it is desired to place the device in a compact unexpanded state, the housing portions may be slid towards each other. When it is desired to expand the viewable size of the display, the housing portions may be slid away from each other.

The display in the device may be a flexible display such as an organic light-emitting diode display. The display may be doubled back on itself once or twice when it is desired to store a portion of the display. A tensioner may be used to provide the display with tension and thereby maintain the display in a desired shape such as a desired planar shape.

The housing portions that slide relative to each other may have interdigitated fingers or other slidably engaged housing structures. The display may be supported on a surface of the housing such as on a front face of the housing. The housing and display may be adjusted by a user. For example, the housing portions may slide between an unexpanded state in which the display has an unexpanded viewable area on the front face and an expanded state in which the display has an expanded viewable area on the front face that is greater than the unexpanded viewable area.

The electronic device housing may have an interior that contains electrical components. A doubled-back portion of a flexible display may be stored in an interior of the housing when the housing is in the unexpanded state.

BRIEF DESCRIPTION OF THE DRAWINGS

FIG. 32 is a cross-sectional end view of an illustrative sliding device in accordance with an embodiment.

FIGS. 33 and 34 are top views of the illustrative sliding device of FIG. 32 in unexpanded and expanded states in accordance with an embodiment.

DETAILED DESCRIPTION

An electronic device may have a display. The display may have an array of pixels for displaying images for a user. The display may be an organic light-emitting diode display, a micro-light-emitting diode display formed from an array of crystalline semiconductor light-emitting diode dies, and/or may be any other suitable display. A two-dimensional touch sensor such as a capacitive touch sensor or other touch sensor may be incorporated into the display (e.g., by forming capacitive sensor electrodes from thin-film display circuitry) and/or a touch sensor layer may be laminated to an array of pixels in the display.

The display of the electronic device may be operated in unexpanded and expanded configurations. In the unexpanded configuration, portability of the device is enhanced. In the expanded configuration, viewable display area is increased, making it easier to provide touch input and to view images on the display.

Figure 1:
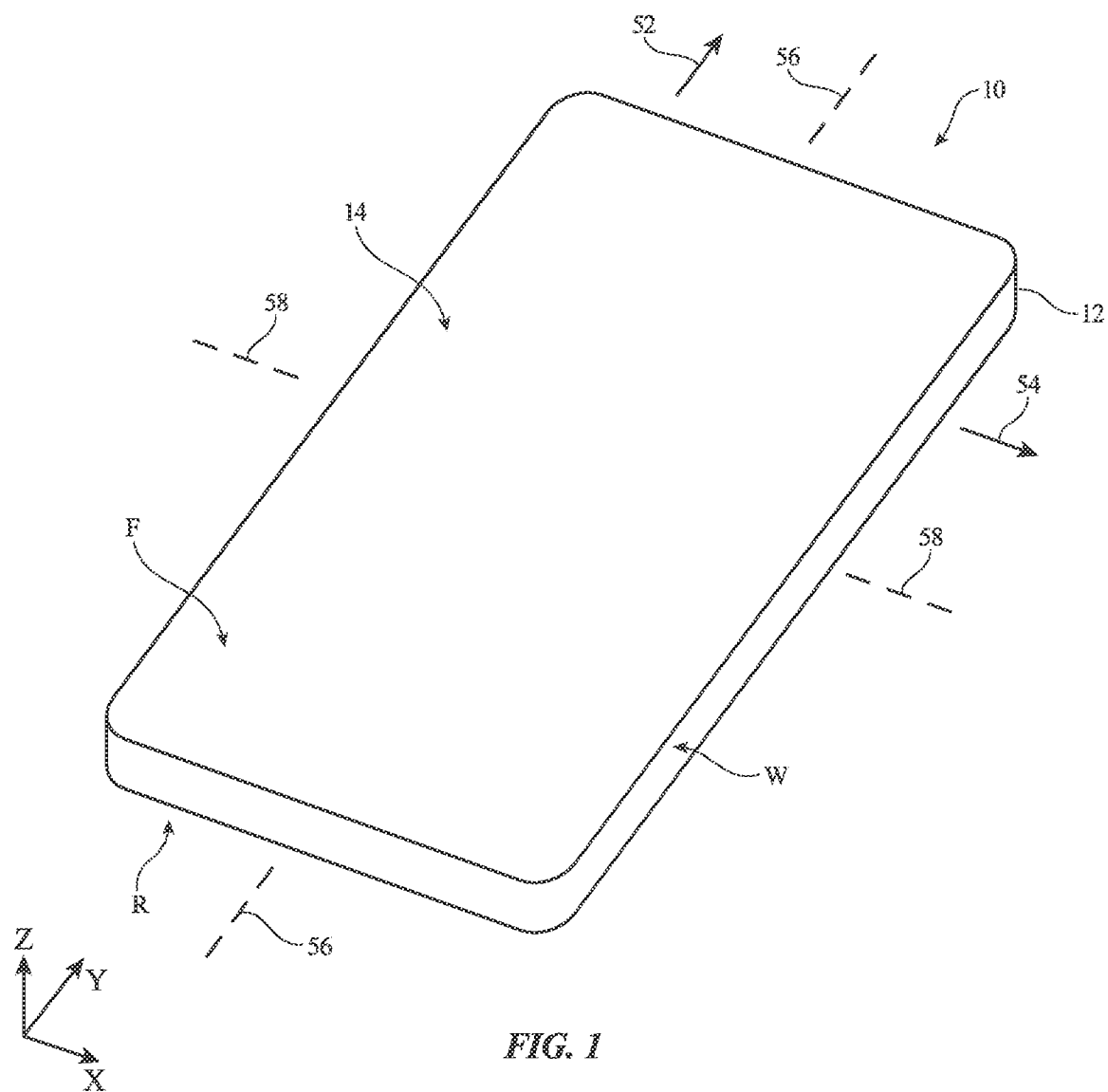
FIG. 1 is perspective view of an illustrative electronic device in accordance with an embodiment.

A perspective view of an illustrative electronic device of the type that may include an expandable display is shown in FIG. 1. Device 10 may be a laptop computer, a computer monitor containing an embedded computer, a tablet computer, a desktop computer, a cellular telephone, a media player, or other handheld or portable electronic device, a smaller device such as a wristwatch device, a wristband device, a pendant device, a headphone or earpiece device, a head-mounted device such as glasses, goggles, a helmet, or other equipment worn on a user's head, or other wearable or miniature device, a television, a computer display that does not contain an embedded computer, a gaming device, a navigation device, an embedded system such as a system in which equipment is mounted in a kiosk, in an automobile, airplane, or other vehicle, a removable external case for electronic equipment, an accessory such as a remote control, computer mouse, track pad, wireless or wired keyboard, or other accessory, and/or equipment that implements the functionality of two or more of these devices. In the illustrative configuration of FIG. 1, device 10 is a portable electronic device such as a cellular telephone or tablet. This configuration may sometimes be described herein as an example.

As shown in FIG. 1, device 10 may have a housing such as housing 12. Housing 12 may be formed from materials such as polymer, glass, metal, crystalline materials such as sapphire, ceramic, fabric, foam, wood, other materials, and/or combinations of these materials. Device 10 may have any suitable shape. In the example of FIG. 1, device 10 has front face F, opposing rear face R, and sidewall portions (sidewalls) W. Portions W may be formed as extensions of the housing structures on front face F, rear face R, and/or may be formed using one or more separate sidewall members (as examples). Sidewall structures may be planar (e.g., to form vertical sidewalls extending between front F and rear R) and/or may have curved cross-sectional profiles. Input-output devices such as one or more buttons may be mounted on housing 12 (e.g., on sidewall portions W).

Device 10 may have one or more displays such as display 14. In the example of FIG. 1, display 14 covers front face F. Display 14 may also be mounted on other portions of device 10. For example, one or more displays such as display 14 may cover all of front face F, part of front face F, some or all of rear face R, and/or some or all of sidewalls W. In some configurations, some or all of display 14 may be covered with flexible or rigid transparent members that serve as protective display cover layers. Such transparent display cover layer structures, which may sometimes be referred to as housing structures, may overlap at least some of display 14 and may serve as a display cover layer. If desired, transparent thin-film structures may serve as protective display layers (e.g., scratch-resistance layers, oleophobic anti-smudge coating layers, etc.).

Display 14 may have a planar shape, a shape with a curved cross-sectional profile, or other suitable shape. In the example of FIG. 1, front face F has a planar shape and lies in the X-Y plane. Display 14 may have a rectangular footprint (outline when viewed from above) or other suitable footprint. Device 10 is elongated along longitudinal axis 56 (e.g., parallel to the Y axis of FIG. 1). The thickness of device 10 in dimension Z, may be less than the width of device 10 in dimension X and less than the length of device 10 in dimension Y (as an example).

To help accommodate a user's desire for compactness while accommodating a user's desire for large amounts of display real estate, device 10 can have structures that allow the shape and size of device 10 and display 14 to be adjusted. In particular, device 10 may have a display and associated housing structures that support folding motions, sliding motions, scrolling motions, and/or other behavior that allows device 10 to be adjusted during use.

When compact size is desired, device 10 can be adjusted to be compact. Device 10 and display 14 may, as an example, be folded inwardly or outwardly about bend axis 58. As another example, sliding or scrolling display structures can be retracted so that device size is minimized.

When a large screen size is desired, device 10 and display 14 can be unfolded (in a configuration in which device 10 is foldable) or display 14 can be expanded laterally in one or more directions such as direction 52 (parallel to longitudinal axis 56) or direction 54 (e.g., a lateral direction that is perpendicular to longitudinal axis 56 and perpendicular to the thickness of device 10). Device 10 and display 14 may, for example, be expanded by sliding portions of device 10 (and display 14) along axis 56 or axis 58 or by unscrolling a scrolled flexible display in direction 52 or direction 54.

When expanded, display 14 exhibits an expanded viewable area. In particular, the portion of display 14 that is viewable by a user of device 10 when device 10 is expanded (sometimes referred to as the expanded viewable area of display 14) is larger than the unexpanded viewable area of display 14 that is presented to a user of device 10 when device 10 is unexpanded. In general, device 10 may use any suitable arrangement that allows display and/or device size and/or shape to be adjusted (e.g., between a first configuration such as an unexpanded viewable area configuration in which a first amount of display 14 is visible to a user viewing the front face of device 10 or other side of device 10 and a second configuration such as an expanded viewable area configuration in which a second amount of display 14 that is greater than the first amount is visible to a user viewing the front face of device 10 or other side of device 10). These arrangements may exhibit inward and/or outward folding, scrolling, sliding, and/or other housing and display movements as device 10 and display 14 are transitioned between unexpanded and expanded states.

Figure 2:
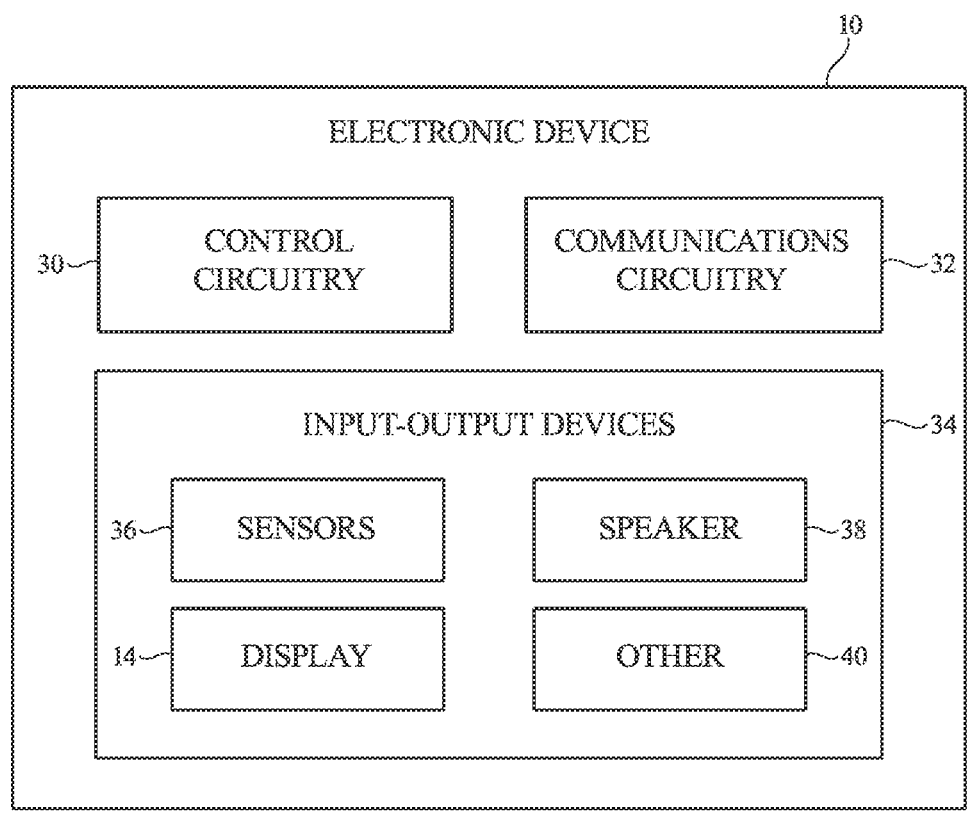
FIG. 2 is a schematic diagram of an illustrative electronic device in accordance with an embodiment.

A schematic diagram of an illustrative electronic device is shown in FIG. 2. As shown in FIG. 2, device 10 may include control circuitry 30, communications circuitry 32, and input-output devices 34.

Control circuitry 30 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 30 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external electronic equipment, control circuitry 30 may communicate using communications circuitry 32. Communications circuitry 32 may include antennas, radio-frequency transceiver circuitry, and other wireless communications circuitry and/or wired communications circuitry. Circuitry 32, which may sometimes be referred to as control circuitry and/or control and communications circuitry, may, for example, support wireless communications using wireless local area network links, near-field communications links, cellular telephone links, millimeter wave links, and/or other wireless communications paths.

Input-output devices 34 may be used in gathering user input, in gathering information on the environment surrounding the user, and/or in providing a user with output.

Display 14 of input-output devices 34 has an array of pixels for displaying images to users. Display 14 may be a light-emitting diode display (e.g., an organic light-emitting diode or a display with a pixel array having light-emitting diodes formed from crystalline semiconductor dies), an electrophoretic display, a liquid crystal display, or other display. Display 14 may include a two-dimensional capacitive touch sensor or other touch sensor for gathering touch input. Display 14 may have a substrate formed from a flexible dielectric (e.g., a sheet of polyimide or other bendable polymer layer) and/or may have rigid substrate structures. Flexible display arrangements may be used to provide display 14 with the ability to alter size and shape by folding, scrolling, sliding, etc. If desired, some or all of display 14 may include rigid (non-flexible) display structures.

Devices 34 may include sensors 36. Sensors 36 may include force sensors (e.g., strain gauges, capacitive force sensors, resistive force sensors, etc.), audio sensors such as microphones, capacitive touch sensors, capacitive proximity sensors, non-capacitive touch sensors, ultrasonic sensors, sensors for detecting position, orientation, and/or motion (e.g., accelerometers, magnetic sensors such as compass sensors, gyroscopes, and/or inertial measurement units that contain some or all of these sensors), muscle activity sensors (EMG), heart rate sensors, electrocardiogram sensors, and other biometric sensors, radio-frequency sensors (e.g., radar and other ranging and positioning sensors), humidity sensors, moisture sensors, and/or other sensors.

Sensors 36 and other input-output devices 34 may include optical components such as light-emitting diodes (e.g., for camera flash or other blanket illumination, etc.), lasers such as vertical cavity surface emitting lasers and other laser diodes, laser components that emit multiple parallel laser beams (e.g., for three-dimensional sensing), lamps, and light sensing components such as photodetectors and digital image sensors. For example, sensors 36 in devices 34 may include optical sensors such as depth sensors (e.g., structured light sensors and/or depth sensors based on stereo imaging devices that can optically sense three-dimensional shapes), optical sensors such as self-mixing sensors and light detection and ranging (lidar) sensors that gather time-of-flight measurements and/or other measurements to determine distance between the sensor and an external object and/or that can determine relative velocity, monochromatic and/or color ambient light sensors that can measure ambient light levels, proximity sensors based on light (e.g., optical proximity sensors that include light sources such as infrared light-emitting diodes and/or lasers and corresponding light detectors such as infrared photodetectors that can detect when external objects are within a predetermined distance), optical sensors such as visual odometry sensors that gather position and/or orientation information using images gathered with digital image sensors in cameras, gaze tracking sensors, visible light and/or infrared cameras having digital image sensors configured to gather image data, optical sensors for measuring ultraviolet light, and/or other optical sensor components (e.g., light sensitive devices and, if desired, light sources), photodetectors coupled to light guides, associated light emitters, and/or other optical components (one or more light-emitting devices, one or more light-detecting devices, etc.).

Input-output devices 34 may also include audio components. The audio components may include one or more microphones to sense sound (e.g., an audio sensor in sensors 36 to sense audio signals) and may include sound-emitting components such as tone generators and one or more speakers. As shown in FIG. 2, for example, input-output devices 34 may include speaker 38. Speakers may be used to support speaker-phone operations and/or may be used as ear speakers when device 10 is being held to a user's ear to make a telephone call, to listen to a voicemail message, or to listen to other audio output.

In addition to sensors 36, display 14, and speaker 38, input-output devices 34 may include user input devices such as buttons and other devices 40. Devices 40 may include, for example, optical components such as light-based output devices other than display 14 that are used to provide visual output to a user. The light-based output devices may include one or more light-emitting diodes, one or more lasers, lamps, electroluminescent devices, and/or other light emitting components. The light-based output devices may form status indicator lights. If desired, the light-based output devices may include illuminated icons (e.g., backlight symbols associated with power indicators, battery charge indicators, wireless signal strength indicators, notification icons, etc.).

Devices 40 may include electromagnets, permanent magnets, structures formed from magnetic material (e.g., iron bars or other ferromagnetic members that are attracted to magnets such as electromagnets and/or permanent magnets), batteries, etc. Devices 40 may also include power transmitting and/or receiving circuits configured to transmit and/or receive wired and/or wireless power signals and output components such as haptic output devices and other output components (e.g., electromagnetic actuators or other actuators that can vibrate to provide a user with a haptic alert and/or haptic feedback associated with operation of a touch sensor or other input devices).

Figure 3:
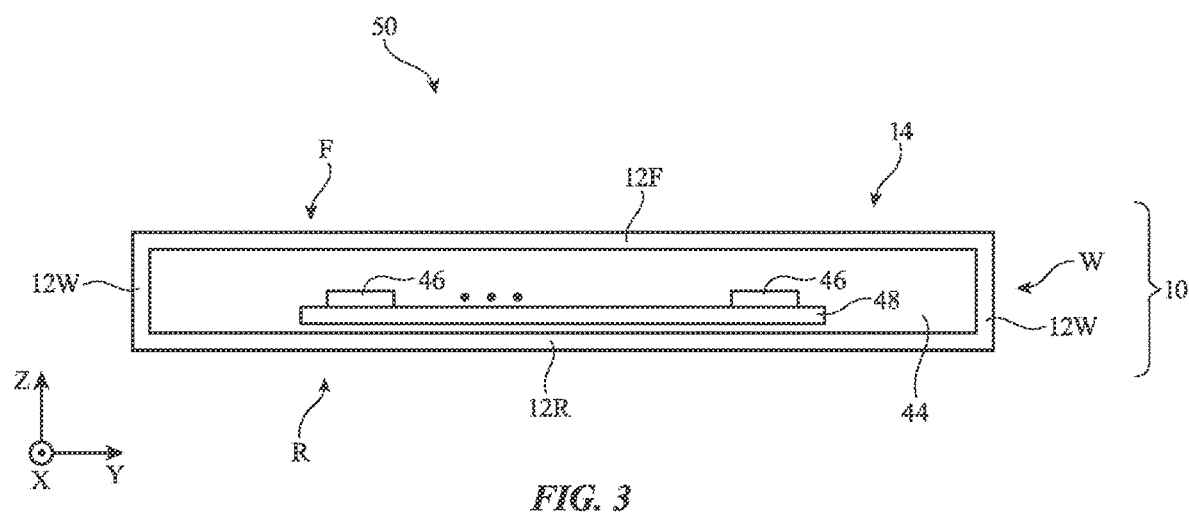
FIG. 3 is a cross-sectional side view of an illustrative electronic device in accordance with an embodiment.

A cross-sectional side view of device 10 of FIG. 1 is shown in FIG. 3. As shown in FIG. 3, housing 12 may have one or more portions such as sidewall portions 12W, front portion 12F on front face F of device 10, and rear portion 12R on rear face R of device 10. These portions may be formed from metal (e.g., aluminum, stainless steel, or other metals) or may be formed from polymer, glass, ceramic, and/or other materials.

Display 14 may be visible on front face F of device 10 and/or other portions of device 10. For example, a viewer who is viewing device 10 in the —Z direction of FIG. 3 (e.g., a user viewing device 10 from the front) may view the pixels of display 14 on front face F that face the user in the +Z direction). Display 14 may be overlapped by transparent portions of housing 12, may have portions that are supported on the outermost surface of housing 12, and/or may have portions that protrude from housing 12. In some configurations, rigid protective transparent materials may form a display cover layer that protects display 14. Display 14 may also be protected by attaching protective thin films to the outermost surface of display 14 and/or by incorporating protective thin films into display 14. As an example, a clear polymer film may overlap the pixels of display 14 to help protect the circuitry of the pixels from damage and/or thin-film organic and/or inorganic layers may be incorporated into display 14 to help protect display 14. In some arrangements, display 14 may include flexible protective material (e.g., a bendable polymer thin film, bendable inorganic thin-film layers, etc.). Transparent materials that may overlap display 14 (e.g., to protect display 14) may be formed from sapphire or other crystalline material, glass, polymer, transparent ceramic, inorganic dielectric materials such as transparent metal oxide thin films and/or other inorganic materials, and/or other transparent material and/or other flexible and/or rigid transparent materials.

The walls of housing 12 may separate interior region 44 of device 10 from exterior region 50 surrounding device 10. Interior region 44 may include components such as components 46. Components 46 may include integrated circuits, discrete components, a battery, wireless circuit components such as a wireless power coil, and/or other components (see, e.g., control circuitry 30, communications circuitry 32, and input-output devices 34 of FIG. 2). Components 46 may be interconnected using signal paths such as paths formed from traces on printed circuits (see, e.g., printed circuit 48).

To accommodate the sometimes competing desires for compact device size and large screen size, device 10 can be adjusted between a first state in which display 14 is unexpanded and a second state in which display 14 is expanded and therefore larger than when unexpanded.

Figure 4:
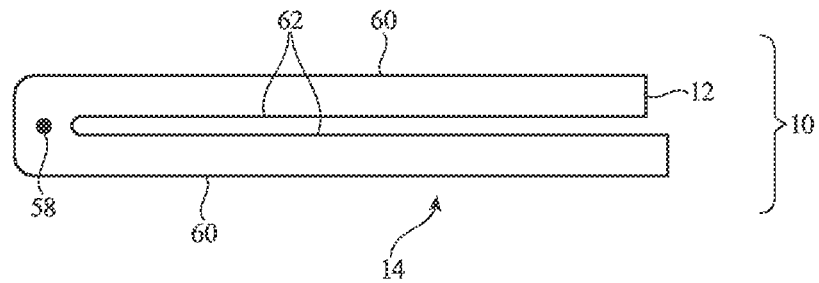
FIG. 4 is side view of an illustrative electronic device with a foldable display in accordance with an embodiment.

With one illustrative arrangement, device 10 accommodates display bending. Display 14 may, for example, be folded inwardly so that left and right halves of display 14 face each other (e.g., when display 14 is formed on surface 62 of housing 12 of FIG. 4). Display 14 may also be folded outwardly so that left and right halves of display 14 face away from each other (e.g., when display 14 is formed on surface 60 of housing 12 of FIG. 4). If desired, device 10 may support both inward and outward folding.

Figure 5:
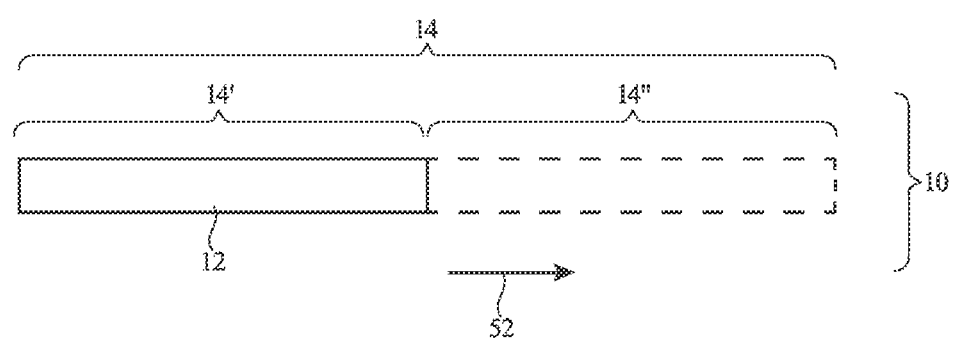
FIG. 5 is a side view of an illustrative electronic device with a sliding display in accordance with an embodiment.

Arrangements in which device 10 allows display 14 to be changed in size using sliding motions may also be used. As shown in FIG. 5, for example, device 10 may be adjusted so that structures in device 10 and display 14 slide (in direction 52 or other suitable direction) between a first (unexpanded) configuration in which only display area 14' is visible and a second (expanded) configuration in which both display area 14' and display area 14" are visible.

Figure 6:
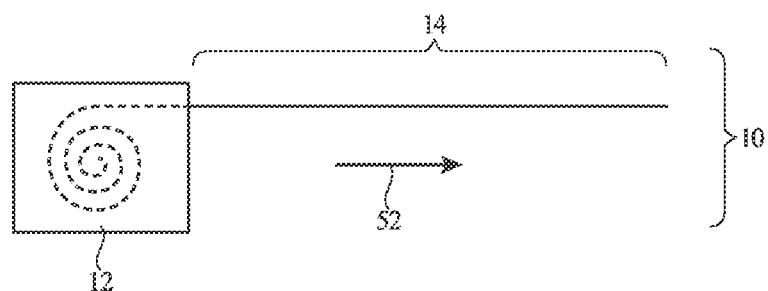
FIG. 6 is a side view of an illustrative electronic device with a scrolling display in accordance with an embodiment.

FIG. 6 is a side view of device 10 in an illustrative configuration in which display 14 is sufficiently flexible to be scrolled. This allows display 14 to move in and out of housing 12. In an unexpanded configuration, display 14 is rolled up and stored in housing 12 of FIG. 6. In an expanded configuration, display 14 is enlarged by unscrolling display 14 in direction 52 and causing display 14 to extend out of housing 12. Other arrangements that allow display 14 to be changed in size and/or shape may also be used and/or combinations of these arrangements and/or the arrangements of FIGS. 4, 5, and 6 may be used.

Figure 7:
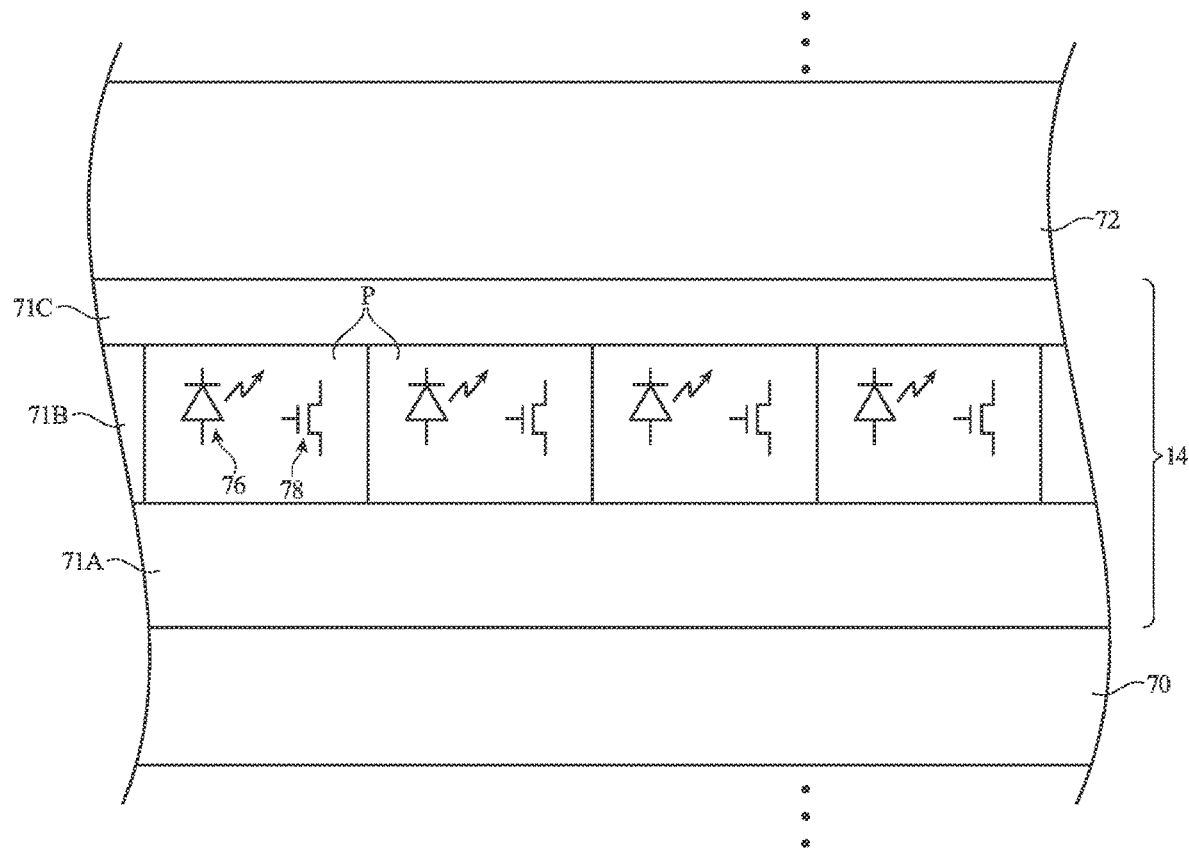
FIG. 7 is a cross-sectional side view of an illustrative flexible display structure in accordance with an embodiment.

If desired, display 14 may have an array of light-emitting pixels P. This type of arrangement is shown in FIG. 7. In the example of FIG. 7, display 14 includes substrate 71A, pixel array 71B, and covering layer 71C. Substrate 71A may be formed from a sheet of polyimide, other flexible polymer layer, or other dielectric. Substrate 71A may be covered by thin-film layers forming pixels P and other thin-film circuitry. Pixels P may include thin-film transistors 78, thin-film capacitors, thin-film light-emitting diodes 76 such as organic light-emitting diodes, and/or other thin-film circuitry. If desired, an array of pixels P for display 14 may be formed from micro-light-emitting diodes (sometimes referred to as microLEDs) formed from crystalline semiconductor dies. These dies may be mounted on a flexible substrate. One or more encapsulation layers such a layer 71C may be used to protect and environmentally seal pixels P. Layer(s) 71C may include organic and/or inorganic dielectric layers (e.g., thin-film layers). Additional layers such as one or more support layers on the rear of display 14 (see, e.g., backing layer 70) and/or one or more outwardly facing layers on the outwardly facing side of display 14 (see, e.g., layer 72) may be attached to display 14, if desired (e.g., using layers of adhesive, by forming thin-film layers directly on display 14 and/or by incorporating other layers overlapped by the pixels P into display 14). Backing layers such a layer 70 may be formed from metal (e.g., thin flexible metal that can withstand repeated bending and unbending), may be formed from polymer, may be formed from other materials, and/or may be formed from combinations of these materials. During bending, layers such as layer 70 may help protect display 14 from wrinkling or other potentially damaging deformation. Additional layer(s) 72 may include polarizer layers, wave plates, filters, protective cover layers, privacy films, and/or other display layers.

Figure 8:
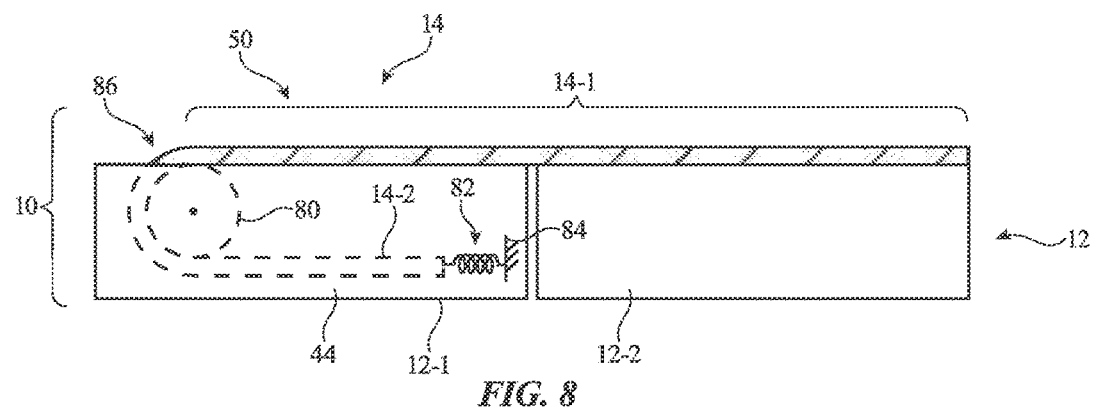
FIG. 8 is a cross-sectional side view of an illustrative electronic device with a sliding display in an unexpanded position in accordance with an embodiment.

FIG. 8 is a cross-sectional side view of an illustrative electronic device with a display that is expandable using a sliding motion. Housing 12 of device 10 of FIG. 8 has portions such as first portion 12-1 and second portion 12-2. Portions 12-1 and 12-2 may slide towards and away from each other. In the arrangement of FIG. 8, portions 12-1 and 12-2 have been placed adjacent to each other so that device 10 and display 14 are in an unexpanded state. Display 14 is a flexible display and may be deployed from interior 44 to exterior 50 through opening 86 (e.g., a slot) in housing 12 using roller 80 or other suitable deployment mechanism. Roller 80 may be coupled to housing 12 by an axle (as an example) and may rotate relative to housing 12. In the unexpanded state of FIG. 8, display has a first portion 14-1 that is viewable from exterior 50 of device 10 and has a second portion 14-2 that is housed within interior 44 and is not viewable from exterior 50. Display 14 may, for example, have one or more bends (folds) that allow display 14 to double back on itself so that portion 14-2 may be stored in interior 44. Housing portions 12-1 and 12-2 (e.g., the upper surfaces of these structures) may be used to help support display 14 and maintain display 14 in a desired shape such as a planar shape. A stretchable elastomeric member, spring, or other tensioner such as tensioner 82 may be coupled between a portion of housing portion 12-1 (see, e.g., attachment structure 84) and an end of display portion 14-2 to help tension display 14 and thereby maintain display 14 in a desired shape (e.g., a planar shape on the surface of housing 12).

Figure 9:
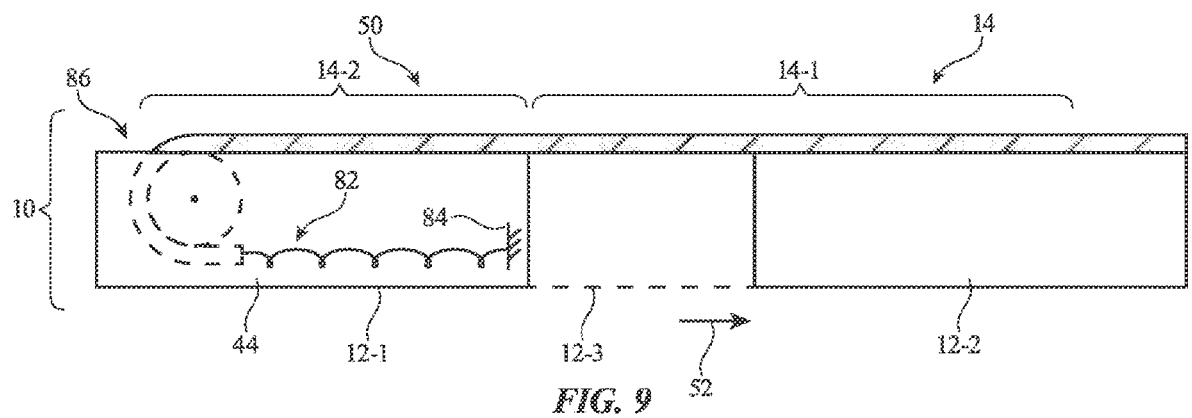
FIG. 9 is a cross-sectional side view of the illustrative electronic device of FIG. 8 with the sliding display in an expanded position in accordance with an embodiment.

When it is desired to extend the area of display 14, housing portion 12-2 may be moved away (e.g., slid away) from housing portion 12-1 in direction 52, as shown in FIG. 9. Supporting portions 12-3 of housing 12 (e.g., rails or other structures associated with housing portion 12-1, associated with housing portion 12-2, and/or other portions of housing 12) may be used to help maintain portion 12-2 in a desired orientation relative to portion 12-1 (e.g., supporting portions 12-3 may be used to maintain angular alignment between portions 12-1 and 12-2). By sliding housing portions 12-1 and 12-2 apart, display 14 may be placed in its expanded state. As shown in FIG. 9, portion 14-2 of display 14 may be removed from interior 44 through opening 86 during expansion, so that the visible area of display 14 in an expanded viewing area configuration includes both portion 14-1 and portion 14-2. Tensioner 82 (e.g., a spring) may expand (e.g., by stretching, etc.) to accommodate movement of portion 14-2 out of interior 44 while providing tension to help flatten display 14 on the outer surface of housing 12.

Figure 10:
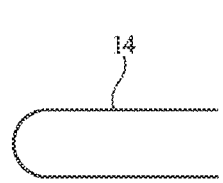
FIGS. 10, 11, and 12 are side views of illustrative flexible display storage configurations with one or more display bends for use in electronic devices with sliding displays in accordance with an embodiment.
Figure 11:
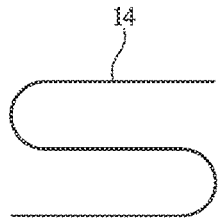
Figure 12:
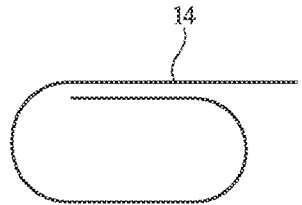

FIGS. 10, 11, and 12 are cross-sectional side views of display 14 showing shapes in which display 14 (e.g., display portion 14-2) may be stored (e.g., in interior 44). Display 14 may be placed in these unexpanded configurations when it is desired to reduce the size of device 10. In the example, of FIG. 10, display 14 has been doubled back on itself using a single bend. This doubled-back display configuration, which is used in the example of FIGS. 8 and 9, allows one half of display 14 to be viewed when display 14 is unexpanded and allows both halves of display 14 to be viewed when display 14 is expanded. In the example of FIG. 11, display has two bends and is doubled back on itself twice when placed in its unexpanded (folded) configuration. A third of display 14 or other suitable portion of display 14 may be viewable when display 14 is unexpanded in this arrangement. When fully expanded, the folded back portions of display 14 of FIG. 11 may be drawn out of the interior of housing 12 through opening 86 and thereby expanded for viewing by a user. A pair of rollers such as roller 80 of FIG. 8 may be used to retract and deploy display 14 in two-bend (twice doubled-back) storage arrangements. Another illustrative storage configuration for display 14 is shown in FIG. 12. In the example of FIG. 12, display 14 is also bent back twice (as with the arrangement of FIG. 11), but both bends are inward bends (inward folds), whereas in the arrangement of FIG. 11, display 14 is first bent inwardly and is then bent in the opposite direction. A pair of rollers at opposing ends of the interior portion of a device housing structure may be used to help store and deploy display 14 in arrangements of the type shown in FIG. 12. Tensioners may be used (e.g., by coupling springs or other tensioners 82 to the interior ends of display 14 of FIG. 11 and/or FIG. 12) to help tension display 14 when display 14 is in the unexpanded and expanded states.

The examples of FIGS. 10, 11, and 12 are illustrative. If desired, display 14 may be stored using other arrangements. For example, display 14 may be wrapped multiple times around a single roller, may slide into in interior portion of housing 12 without bending, and/or may otherwise be stowed when it is desired to place display 14 in its unexpanded state. When display 14 is doubled back on itself so that display 14 has one or two bends and associated doubled-back planar sections, display 14 may avoid some of the stress that might otherwise be experienced by wrapping display 14 repeatedly about a roller.

Figure 13:
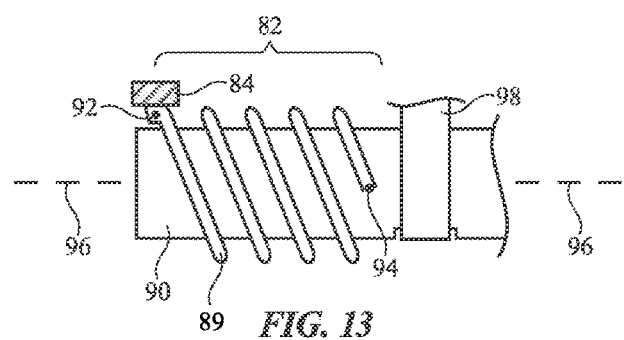
FIG. 13 is a top view of an illustrative flexible display tensioner such as a coil spring in accordance with an embodiment.

Tensioner 82 may be a flat spring, a clock spring, a leaf spring, an extension spring, a compression spring, a coil spring, a stretchable elastomeric member, and/or other suitable tensioning device. A top view of an illustrative tensioner formed from a coil spring is shown in FIG. 13. As shown in FIG. 13, the coil spring forming tensioner 82, which may sometimes be referred to as a torsion spring, may have a helical spring member such as member 89 attached to an interior support in device 10 such as support 84 at attachment point 92. Helical spring member 89, which may be formed from a material such as spring metal, may have an opposing end that is attached to roller 90 at point 104. Roller 90 may have an axle coupled to housing 12 and may rotate about rotational axis 106. Coupling member 108 (e.g., a flexible band) may wrap around roller 90 and may be attached to the edge of flexible display 14. When spring 82 is relaxed, coupling member 108 will be retracted towards spring 82 and wrapped around roller 90. In this state, display portion 14-2 will be retracted into housing interior 44, as shown in FIG. 8. When display 14 is pulled out of interior 44 in response to sliding apart housing portions 12-1 and 12-2, coupling member 108 will unwrap from roller 90 while tightening helical spring member 89. Other types of tensioning mechanisms may be used to tension the edges of display 14, if desired. The coil spring example of FIG. 13 is illustrative.

Housing portions 12-1 and 12-2 may be the same size, housing portion 12-1 may be larger than housing portion 12-2, or housing portion 12-2 may be larger than housing portion 12-1. Housing portions 12-1 and 12-2 may have the same shape (or nearly the same shape) or may have different shapes that engage with each other. In the illustrative example of FIG. 14, housing portion 12-2 has a thin protruding portion 12-2P (formed from one or more strip-shaped members) that extends over a box-shaped structure forming main housing portion 12-1. Electrical components may be mounted in the interior of portion 12-1 and/or portion 12-2. For example, a battery, control circuitry, and other components may be mounted in the interior of main housing portion 12-1 in the example of FIG. 14.

Figure 14:
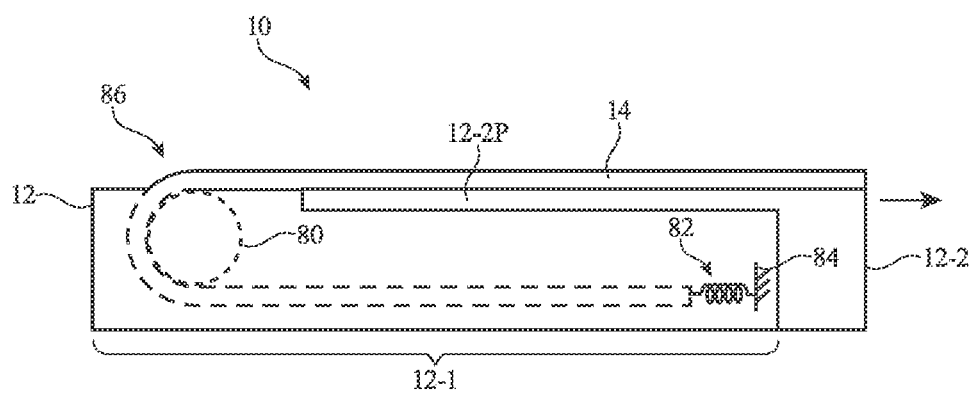
FIG. 14 is a cross-sectional side view of an illustrative electronic device with a sliding display in accordance with an embodiment.
Figure 15:
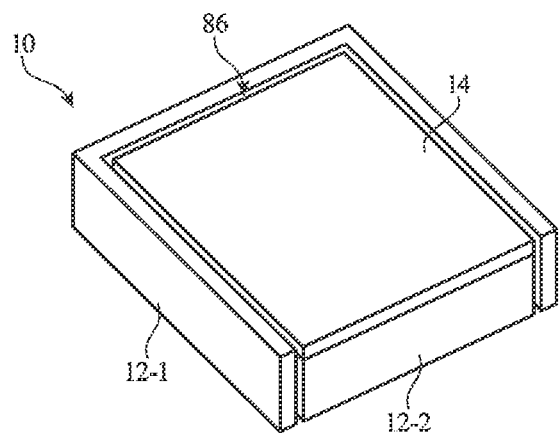
FIGS. 15 and 16 are perspective views of the illustrative electronic device of FIG. 14 in unexpanded and expanded configurations in accordance with an embodiment.
Figure 16:
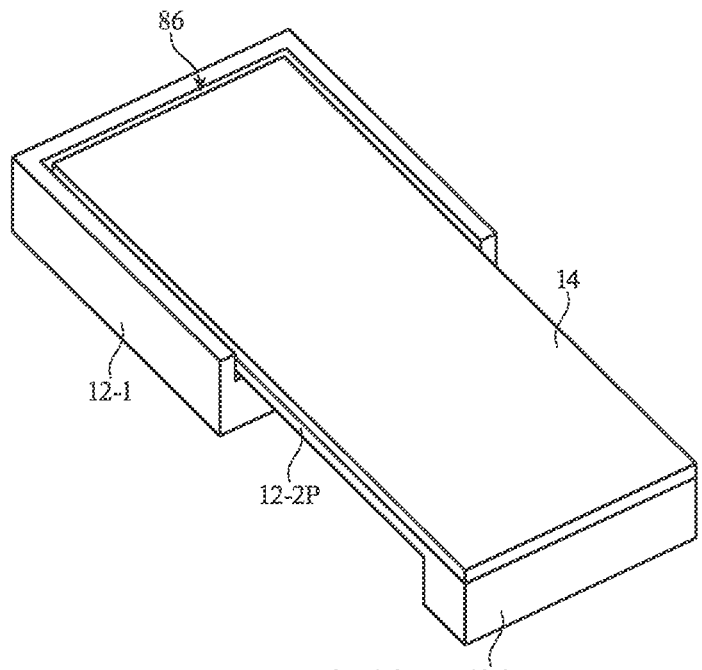

As described in connection with FIGS. 8 and 9, display 14 of FIG. 14 may be a flexible display that extends around internal roller 80 during storage of display 14 in housing 12 when display 14 is in its unexpanded state. When display 14 is in its unexpanded state, a first portion of display 14 is visible, as shown in FIG. 15. When portion 12-2 is slid away from portion 12-1, protruding portion 12-2P slides off of the upper surface of portion 12-1 and display 14 is drawn out of the interior of portion 12-1 through opening 86. The places display 14 in its expanded state, as shown in FIG. 16.

Figure 17:
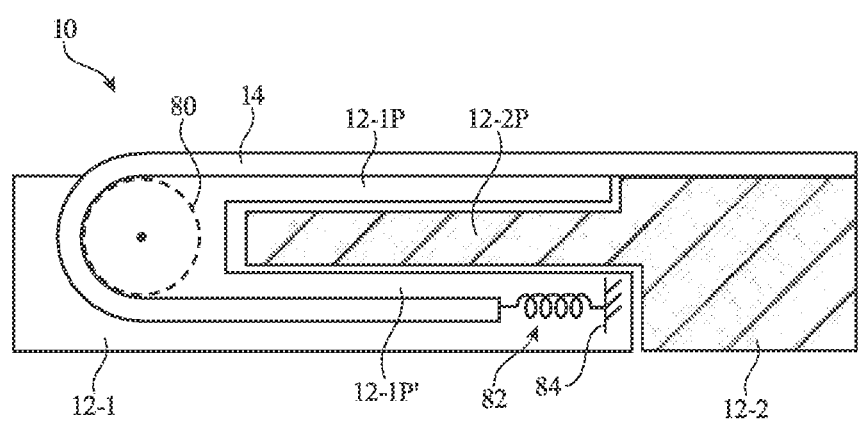
FIG. 17 is a cross-sectional side view of an illustrative electronic device with a sliding display in accordance with an embodiment.

If desired, a protruding structure in one portion of housing 12 may be received within a recess of another portion of housing 12. Consider, as an example, the arrangement of FIG. 17. In the example of FIG. 17, housing portion 12-1 has a recess formed between lower structure 12-1P' and upper structure 12-1P. When display 14 is in its unexpanded configuration, protruding structure 12-2P of housing portion 12-2 protrudes into and is received within the recess in structure 12-1. Because upper structure 12-2P may remain in place even when protruding structure 12-2P has been withdrawn from the recess, the presence of upper structure 12-1P may help support display 14 on the outer surface of device 10 when display 14 is expanded. Structures of the type show in FIG. 17 may be formed across the entire width of device 10 and/or interdigitated structures may be formed. The interdigitated protrusions of housing 12 may sometimes be referred to as interlocking (interdigitated) rails, protrusions, strip-shaped protrusions, strip-shaped members, fingers, prongs, etc.

Device 10 may, in general, use trailing edge or leading edge configurations for deploying display 14. In the arrangement of FIG. 17, for example, the roller and supplemental storage area used for deploying additional portions of display 14 are located in housing 12-1, which is sometimes referred to as the trailing side of housing 12, because housing 12-2 is pulled out of housing 12-1 and extends outwardly in a leading fashion away from housing 12-1. If desired, roller 80 may be located in housing 12-2 and/or portions of display 14 may be stored within housing 12-2 when device 10 is in its unexpanded configuration.

Figure 18:
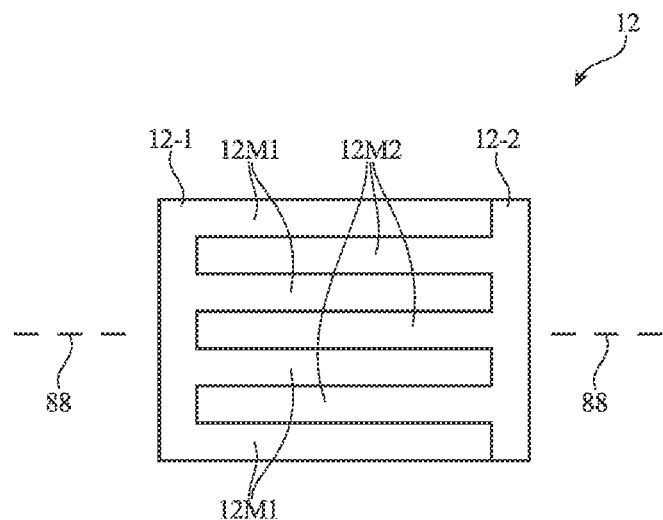
FIGS. 18 and 19 are top views of an illustrative expandable electronic device housing structure with sliding interdigitated members in respective unexpanded and expanded configurations in accordance with an embodiment.

A top view (front face view) of an illustrative pair of interlocking housing structures with interdigitated members (e.g., interdigitated members that extend across front face F) is shown in FIG. 18. As shown in FIG. 18, device 10 may have interlocking housing portions 12-1 and 12-2 that are configured to allow housing portions 12-1 and 12-2 to slide towards and away from each other. This may allow the size of display 14 to be adjusted. For example, display 14 may be a flexible display having a first portion stored inside housing portion 12-1 when display 14 is in its unexpanded state and a second portion attached to housing portion 12-2. When housing portion 12-2 is moved away from housing portion 12-1, display 14 may be pulled out of housing portion 12-1 to increase the viewable size of display 14.

Figure 19:
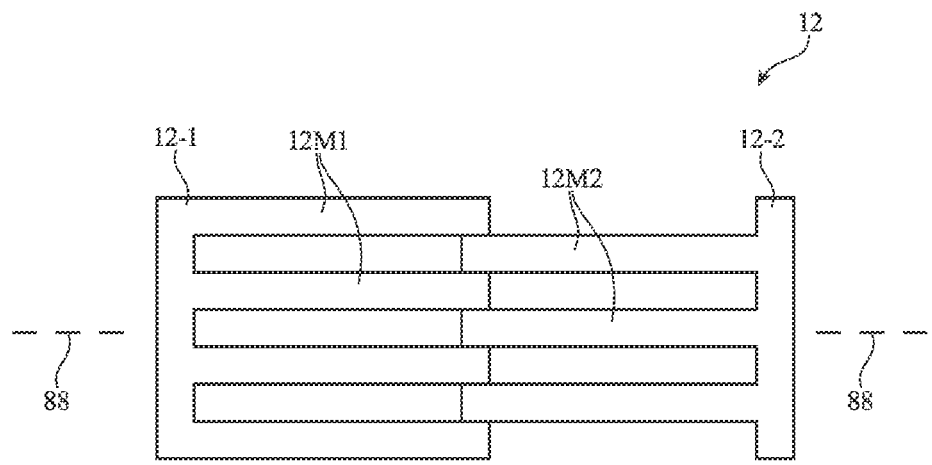

Housing portion 12-1 of FIG. 18 has a series of elongated members (sometimes referred to as fingers) such as members 12M1 and housing portion 12-2 may have a series of interlocking offset elongated members (fingers) such as members 12M2. The recesses formed between adjacent members on one portion (e.g., the elongated recesses between respective pairs of adjacent members 12M1) are configured to receive the elongated members of the other portion (e.g., members 12M2) and vice versa. The interlocking structures of FIG. 18 (e.g., the members of portion 12-1 and the corresponding members of portion 12-1) are configured to slidably engage so that housing portion 12-1 and 12-2 slide with respect to each other while serving as a robust support for display 14. The illustrative housing of FIG. 18 is shown in an expanded configuration (following sliding movement to move portions 12-1 and 12-2 away from each other) in FIG. 19.

The sizes of members 12M1 and 12M2 may be equal or members 12M1 may be larger or smaller than members 12M2. There are four of members 12M1 and three of members 12M2 in the example of FIG. 18, but in general each housing portion may have any suitable number of protruding members (e.g., at least one, at least two, at least five, at least 10, 10-40, fewer than 100, fewer than 75, fewer than 30, fewer than 12, fewer than 3, or other suitable number. Members 12M1 and/or 12M2 may extend at least 10% of the length of device housing 12, at least 30%, at least 75%, less than 100%, less than 60%, or other suitable amount.

The elongated fingers of housing 12 of FIG. 18 facilitate sliding of portions 12-1 and 12-2 relative to each other along the longitudinal axis of the elongated fingers (e.g., along axis 88, which may run parallel to longitudinal axis 56 of FIG. 1). Display 14 may be supported by members 12M1 and 12M2 in both unexpanded and expanded configurations. When portions 12-1 and 12-2 are moved towards each other (e.g., by sliding portions 12-1 and 12-2 towards each other along axis 88), housing 12 may have an unexpanded configuration of the type shown in FIG. 18. When it is desired to expand display 14, portions 12-1 and 12-2 may be moved away from each other (e.g., portions 12-1 and 12-2 may be slid apart along axis 88). This places housing 12 (and overlapping display 14 of device 10) in an expanded configuration, as shown by expanded housing 12 of FIG. 19.

Figure 20:
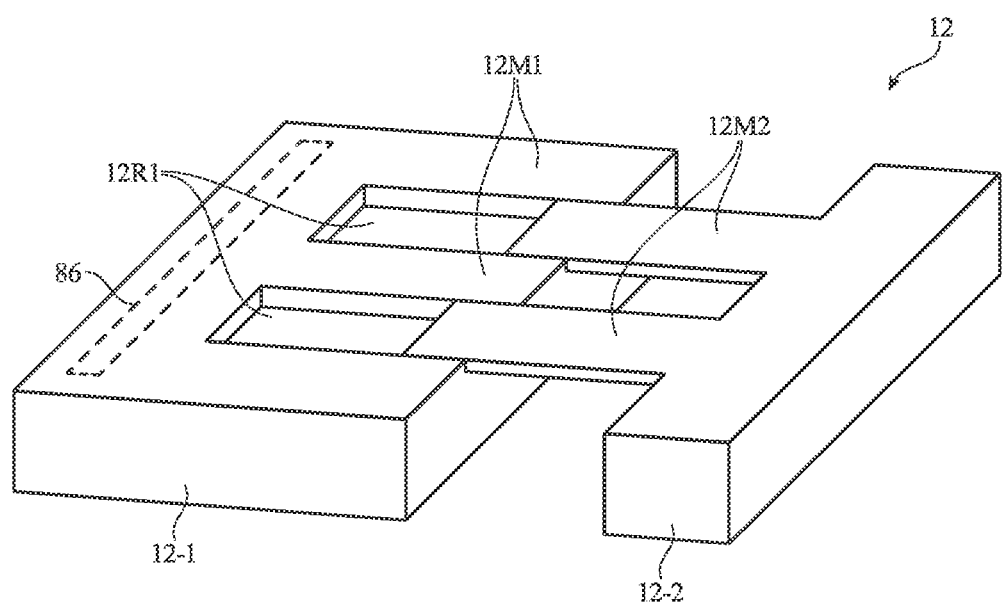
FIGS. 20, 21, 22, and 23 are perspective views of illustrative expandable electronic device housing structures with sliding interdigitated members in accordance with embodiments.

FIG. 20 shows how portions of housing 12 (e.g., portion 12-1) may have slots or other openings (see, e.g., illustrative housing opening 86) to accommodate display 14. When device 10 is in its unexpanded state, display 14 may be doubled back on itself one or more times or otherwise stowed in the interior of housing portion 12-1 to reduce the exposed length of display 2. When device 10 is expanded, display 14 may be pulled out of the interior of portion 12-1 through opening 86 and may be supported on the outer surfaces of members 12M1 and 12M2. Recesses 12R1 for receiving members 12M2 may be open to the interior of portion 12-1 or may be formed in the surface of a housing wall that covers the upper surface of portion 12-1.

In arrangements of the type shown in FIG. 20, housing portions 12-1 and 12-2 may be unequal in size (e.g., the interior volume of portion 12-2 may be less than the interior volume of portion 12-1 as shown in FIG. 20). In the illustrative configuration of FIG. 21, housing portions 12-1 and 12-2 have sizes that are equal or nearly equal (e.g., the interior volume and/or exterior volume occupied by portions 12-1 and 12-2 may differ by less than 25%, less than 15%, or less than 8%). In this type of arrangement, portion 12-1 may be used for display storage when display 14 is unexpanded and portion 12-2 may be used to housing a battery, control circuitry, and other electronic components and/or other sets of components may be stored in housing portion 12-1 and/or housing portion 12-2.

Figure 21:
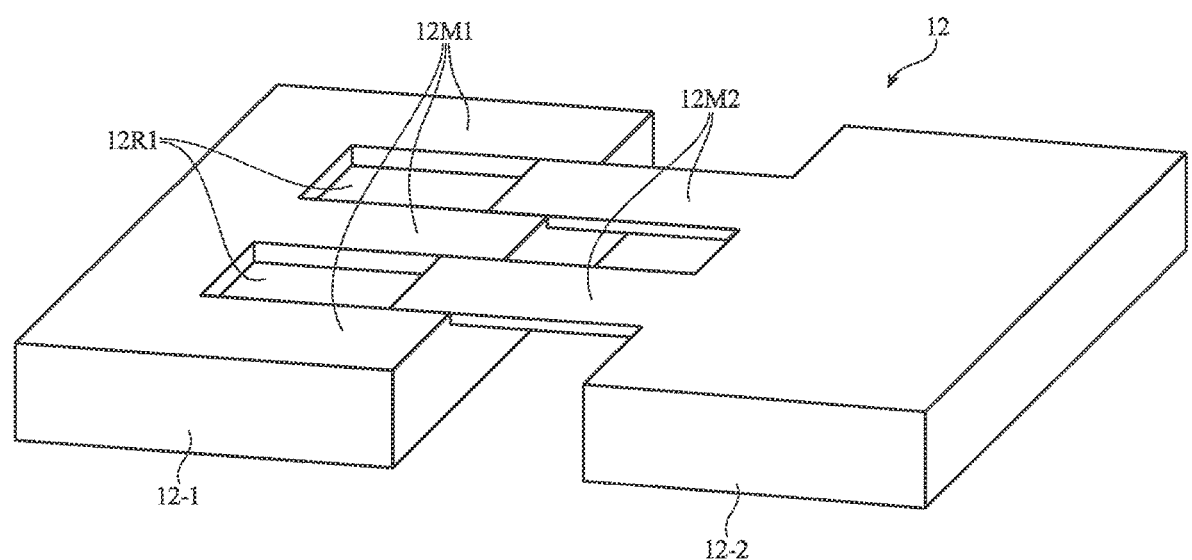
Figure 22:
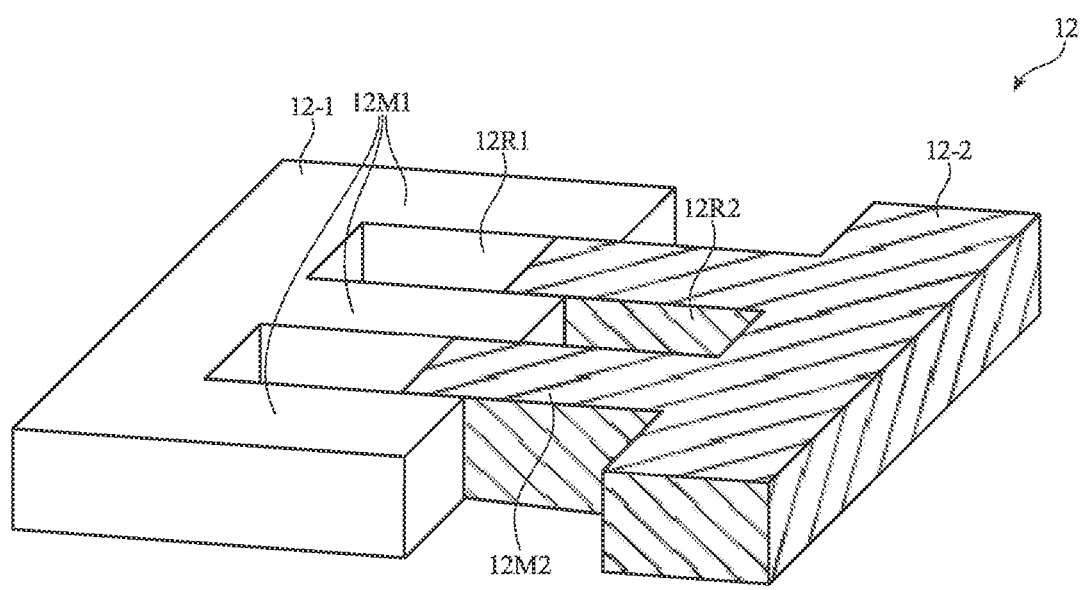

In the arrangement of FIG. 21, members 12M2 are thin strip-shaped protrusions that are received within shallow mating recesses 12R1. If desired, members 12M2 may occupy some or all of the thickness of housing 12. FIG. 22 is a perspective view of housing 12 in a configuration in which interdigitated members 12M1 and 12M2 extend through the entire thickness of housing 12. Housing portion 12-1 includes through-housing recesses such as recesses 12R1 to receive members 12M2 and housing portion 12-2 includes through-housing recesses such as recesses 12R2 to receive members 12M1.

Figure 23:
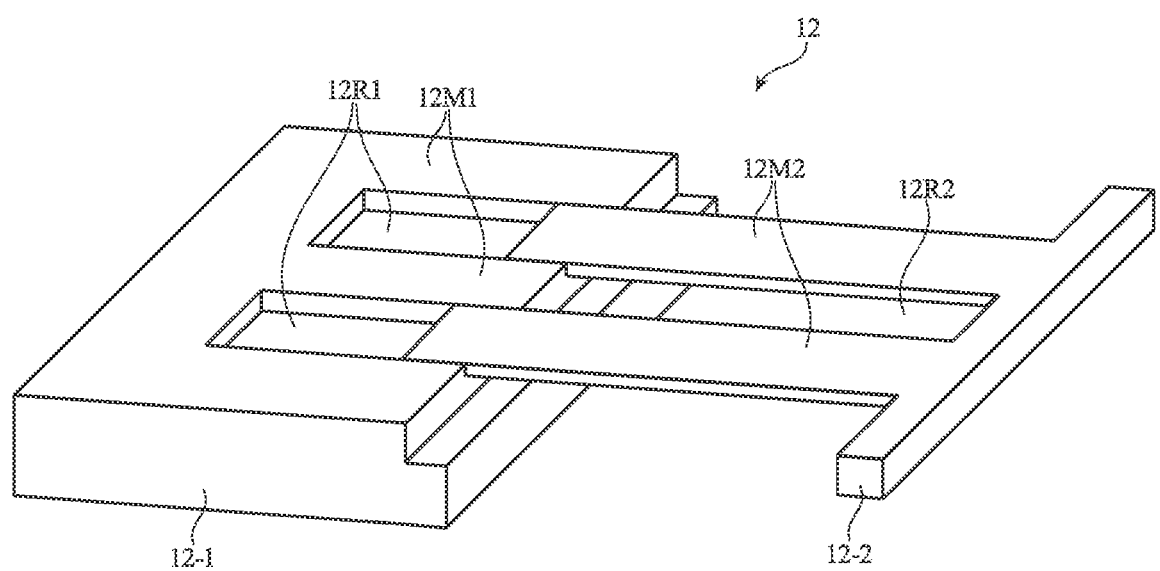

Another interlocking sliding arrangement for housing 12 is shown in FIG. 23. As shown in FIG. 23, housing portion 12-1 may be substantially larger than housing portion 12-2, which allows a portion of display 14 and other electrical components to be stored in housing portion 12-1 when display 14 is in its unexpanded state (e.g., display 14 may have a portion that is stored with two or three layers that are doubled back on each other using one or more rollers or other structures, as described in connection with FIGS. 10, 11, and 12). Components may also be stored in housing portion 12-2 or housing portion 12-2 may serve primarily as a supporting and connecting member that helps secure the ends of elongated members 12M2.

Figure 24:
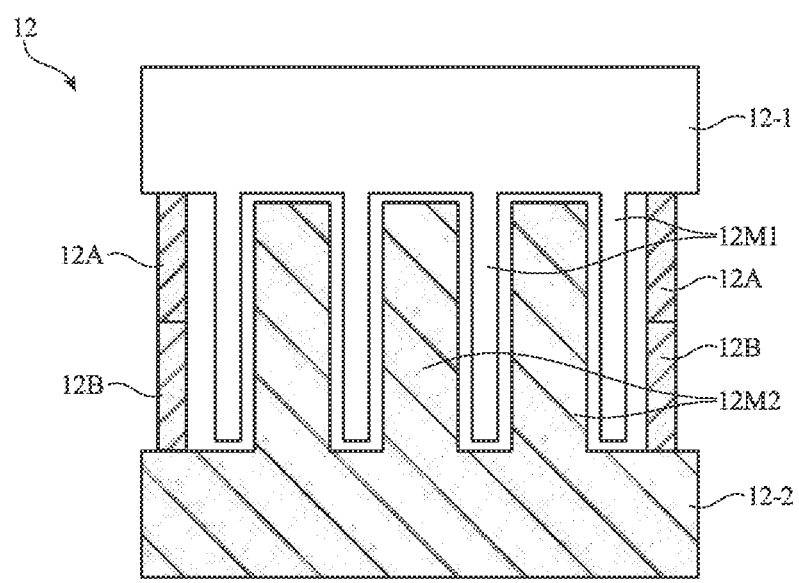
FIG. 24 is a top view of an illustrative expandable electronic device housing structure with supporting side members in accordance with an embodiment.

FIG. 24 is a top view of housing 12 in an illustrative configuration in which telescoping supporting members (e.g., supporting housing portions 12-3 of FIG. 9, which may be fully or partially formed from structures in portion 12-1 and/or 12-2) have been formed from tubular members 12A (coupled to portion 12-1) and nesting tubular members 12B (coupled to portion 12-2). Members 12A and 12B may be relatively strong supporting members and may have a different shape than members 12M1 and 12M2. For example, members 12M1 and 12M2 may be formed from thin strip-shaped protrusions that have relatively large surface areas for supporting display 14 in a planar shape, whereas the telescoping support structures formed from members 12A and 12B may have tubular shapes or other suitable shapes. Members 12A and 12B in this type of arrangement may not be used in directly supporting display 14, but may be sufficiently strong to help maintain portions 12-1 and 12-2 in a desired angular relationship with respect to each other while allowing members 12-1 and 12-2 to be slid towards and away from each other to adjust the size of display 14 (e.g., to adjust the size of the portion of display 14 that is visible to a user on front face F of device 10).

The interlocked structures of portions 12-1 and 12-2 may have shapes of the types shown in FIGS. 25, 26, 27, and 28 and/or other suitable shapes.

Figure 25:
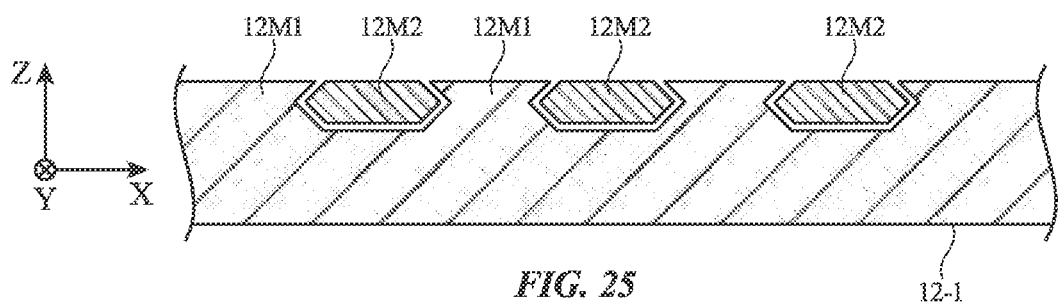
FIGS. 25, 26, 27, and 28 are cross-sectional views of illustrative sliding structures for expandable electronic device housings in accordance with embodiments.

In the example of FIG. 25, members 12M2 are elongated (extending into the page parallel to the Y axis) and have thin strip-shaped configurations. The thickness of members 12M2 in the Z dimension may be less than the width of members 12M2 in the X dimension. Members 12M2 may be received for sliding movement within shallow recesses in the surface of portion 12-1. Portions of housing portion 12-1 that lie between the shallow recesses may form members 12M1. The shapes of the sidewalls of members 12M2 and the corresponding shapes of the sidewalls of the recesses that receive members 12M2 may have triangular ross-sectional shapes or other shapes that help retain members 12M2 within portion 12-1 and prevent members 12M2 from being pulled out of the recesses upwards along the Z dimension while allowing members 12M2 and the rest of portion 12-2 to slide with respect to portion 12-1 (e.g., along the Y dimension). Lubricious coatings and/or lubricant that is separate from members 12M1 and 12M2 may be provided to reduce sliding friction (if desired). Display 14 may be coupled directly to the exposed surfaces of members 12M2 or a support layer (e.g., a thin flexible sheet) that forms a rear backing layer for display 14 may be coupled to the exposed surfaces of members 12M2. Solid and/or segmented or grid-shaped sheets may be used as support layers.

Figure 26:
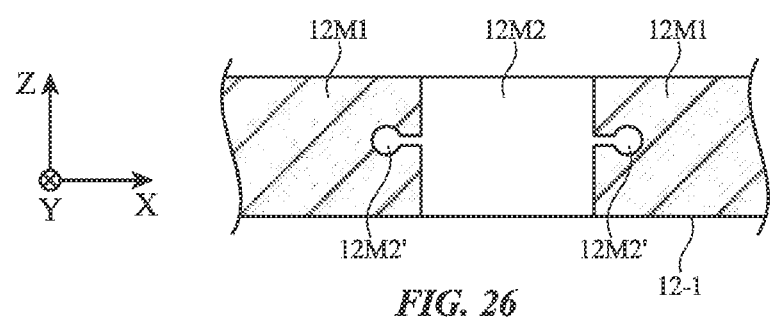

In the example of FIG. 26, members 12M1 have recesses that receive lateral protrusions 12M2' of members 12M2. Protrusions 12M2' may have shapes that help retain members 12M2 within the recesses formed in portion 12-1 while allowing members 12M2 to slide relative to portion 12-1.

Figure 27:
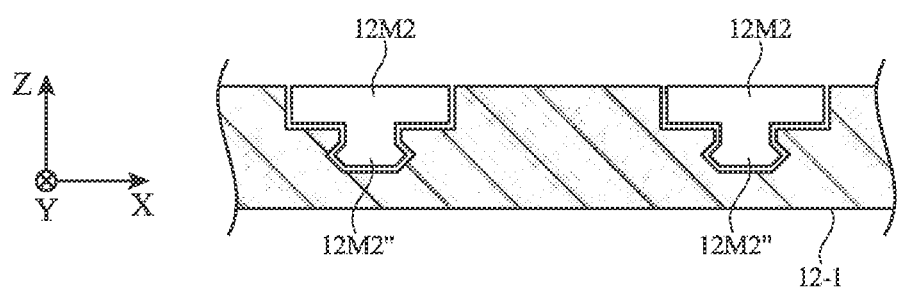

Another illustrative arrangement is shown in FIG. 27. In the configuration of FIG. 27, members 12M2 have downwardly extending protrusions 12M2" that are received within corresponding recesses in portion 12-1. As with the illustrative arrangements of FIGS. 25 and 26, members 12M2 and other structures in portion 12-2 and the structures of portion 12-1 may be configured to retain members 12M2 in desired positions in the X and Z dimensions while allowing members 12M2 to slide with respect to portion 12-1 along the Y dimension (e.g., parallel to the longitudinal axis of device 10 and/or other suitable direction). Display 14 may be coupled directly to the exposed surfaces of members 12M2 (e.g., using adhesive, etc.) and/or a supporting layer that is attached to the rear surface of display 14 may be coupled to members 12M2.

Figure 28:
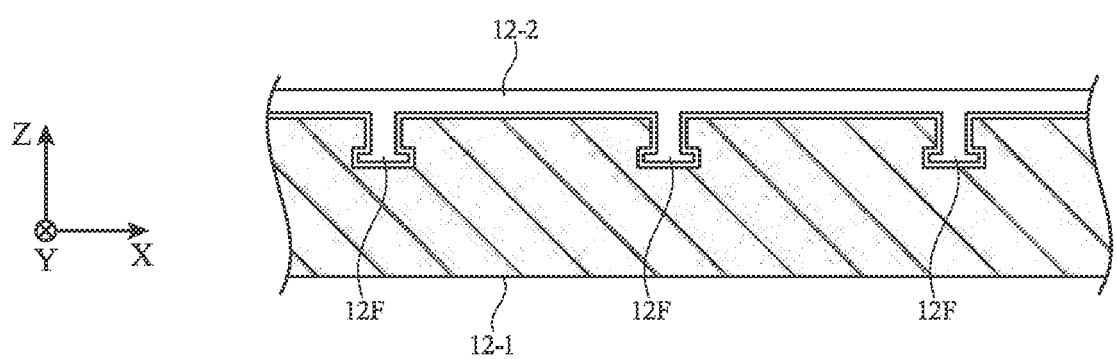

In the arrangement of FIG. 28, portion 12-2 includes a housing layer that is coupled to a series of protrusions 12F. Protrusions 12F and the other protrusions associated with housing portion 12-2 such as protrusions 12M2" of FIG. 27, protrusions 12M2' of FIG. 26, and/or the protrusions on the opposing edges of each of members 12M2 of FIG. 25, may extend in a continuous strip along the entire length (or nearly the entire length) of elongated members 12M or, if desired, protrusions 12F and other elongated member protrusions (see, e.g., FIGS. 25, 26, and 27) may be formed at a series of discrete locations along the lengths of members 12M2.

In the examples of FIGS. 25, 26, 27, and 28, members 12M2 of portion 12-2 have been provided with protruding portions that interlock with corresponding recesses in portion 12-1. These arrangements, in which the elongated members of one housing portion slidably engage with recesses and/or elongated members of another housing portion, allow housing 12 to be slidably moved between expanded and unexpanded states. If desired, portions 12-1 and 12-2 may be configured to interlock while permitting sliding motion between portions 12-1 and 12-2 using other engagement structures. For example, members 12M2 may contain recesses that receive corresponding protrusions from portion 12-1.

Figure 29:
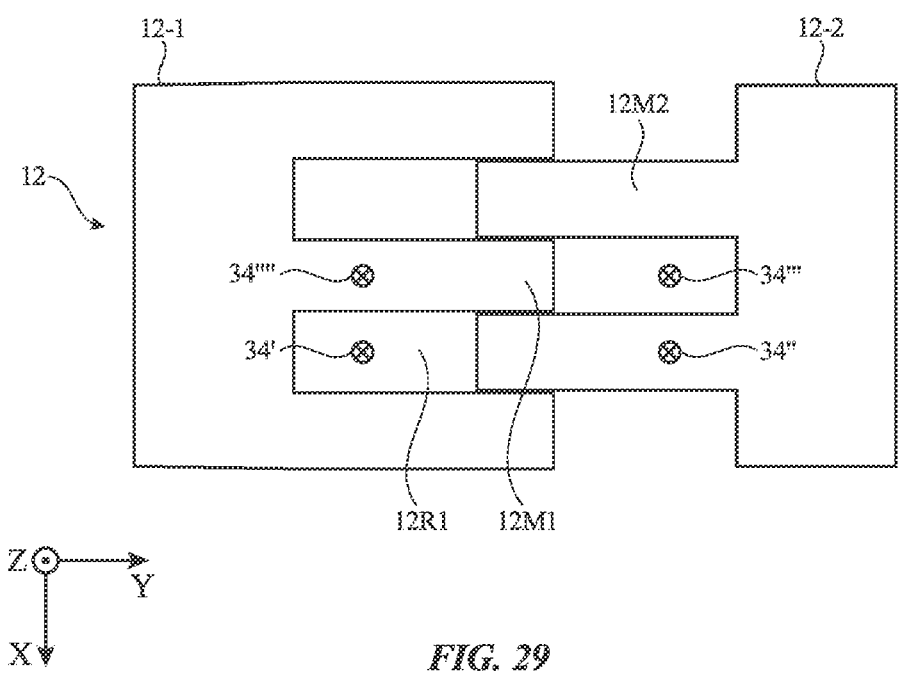
FIG. 29 is a top view of an illustrative expandable electronic device housing structure showing illustrative locations for electrical components in accordance with an embodiment.

Input-output devices 34 (e.g., electrical components) such as optical sensors and other optical components (e.g., light-emitting devices), may be mounted on elongated housing members 12M1 and/or 12M2, may be embedded within elongated housing members 12M1 and/or 12M2, may be mounted behind members 12M1 and/or 12M2, may be mounted in interior portions of housing 12, and/or may be coupled to other portions of device 10. Illustrative locations for devices 34 are shown by illustrative locations 34', 34", 34''', and 34'''' of FIG. 29. In each of these positions, one or more input-output devices 34 may emit light, may detect light, and/or may otherwise receive environmental measurements, gather user input, and/or or provide output to a user. In arrangements in which input-output devices 34 are mounted behind a housing wall (e.g., behind a portion of an elongated housing member or other housing structure), one or more windows may be formed in the housing wall. Windows may be configured to pass light (e.g., transparent window structures in a housing may be formed to allow light to be emitted and/or detected by an optical component), may be configured to pass radio-frequency signals (e.g., to accommodate an antenna), and/or may otherwise be formed from an opening and/or an optically transparent structure, radio-transparent structure, and/or other window structure in housing 12. If desired, light and/or other signals associated with operation of input-output devices 34 may pass through openings or other window structures (e.g., transparent window regions) in display 14.

Figure 30:
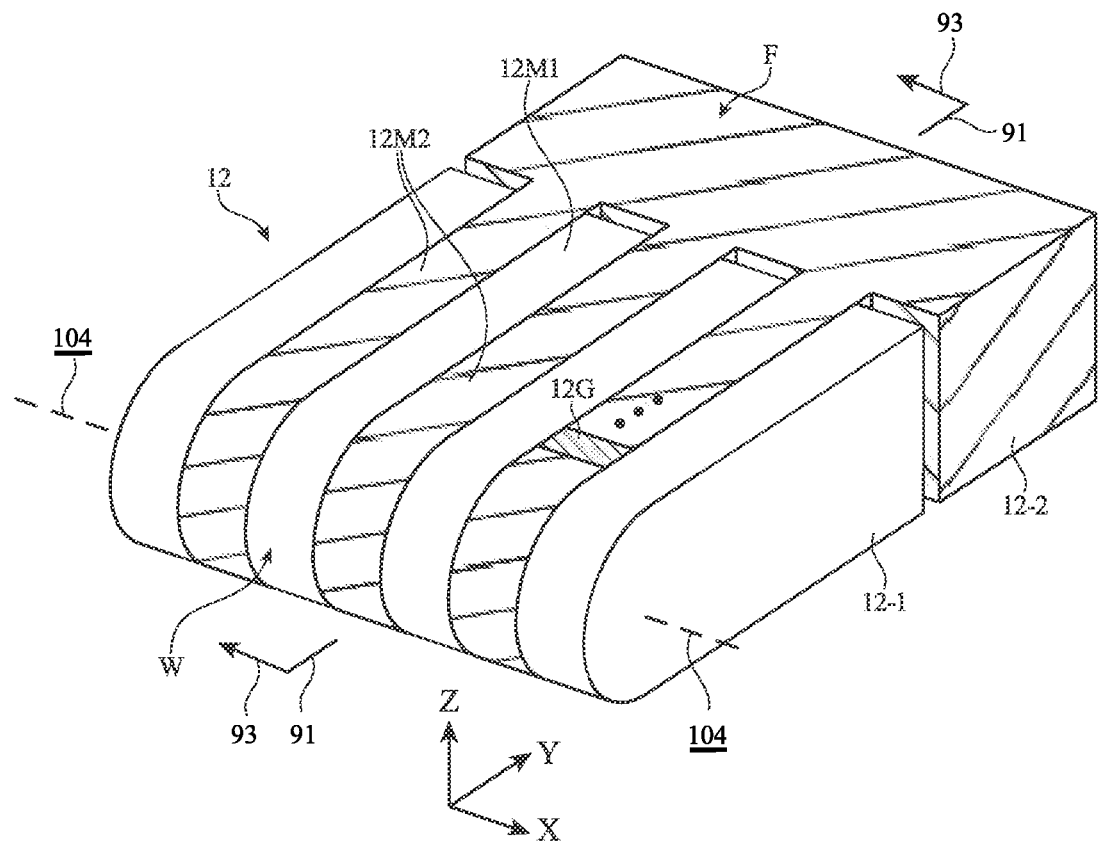
FIG. 30 is a perspective view of an illustrative expandable electronic device housing structure with flexible sliding interdigitated members in accordance with an embodiment.

FIG. 30 is a perspective view of an illustrative expandable electronic device housing structure. In the example of FIG. 30, elongated members 12M2 have been formed from thin flexible strips that accommodate bending of the tips of members 12M2 around curved sidewall W at the curved end of housing portion 12-1 (e.g., the edge of housing portion 12-1 facing away from housing portion 12-2). The curved end of housing portion 12-1 may have recesses that receive members 12M2 and that guide members 12M2 around bend axis 94. Members 12M2 of FIG. 30 and the other FIGS. may be solid pieces of polymer, metal, other materials, and/or combinations of these materials, and/or may each have optional linked segments such as illustrative segments 12G of FIG. 30 to enhance flexibility. Members 12M2 and portion 12-1 may, if desired, have engagement structures (see, e.g., FIGS. 25, 26, 27, and 28) that help retain members 12M2 in desired positions relative to portion 12-1 and that help align portions 12-1 and 12-2 at a desired orientation as portions 12-1 and 12-2 are slid towards and away from each other. Flexible display 14 may be coupled to the exposed surfaces of members 12M2.

When device 10 is in an unexpanded configuration, display 14 may have a first portion that lies flat on the upper surface of portion 12-2 including the upper surfaces of members 12M2 on front face F of device 10. Display 14 may also have a second portion that wraps around curved sidewall W and a third portion that extends along some or all of rear face R. When expanded, members 12M2 slide out of the tracks formed from the recesses in portion 12-1 and portion 12-2 slides away from portion 12-1. In its fully expanded state, the second and third portions of display 14 move around to front face F from sidewall W and rear face R by following sliding members 12M2.

Figure 31:
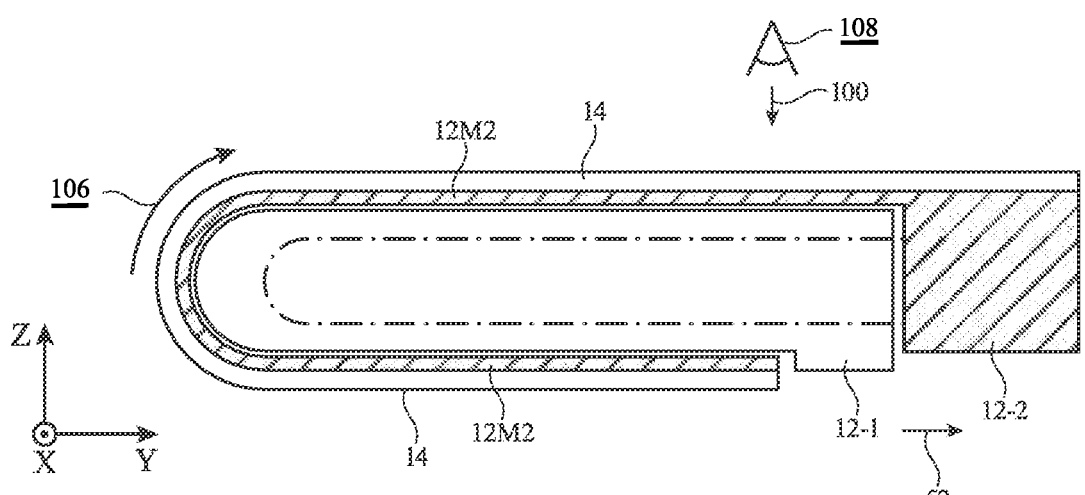
FIG. 31 is a cross-sectional side view of the illustrative expandable electronic device housing structure of FIG. 30 showing how a flexible display may wrap around an edge of the housing structure and may be supported by the flexible sliding interdigitated members in accordance with an embodiment.

In the perspective view of FIG. 30, display 14 of device 10 is not present. FIG. 31 is a cross-sectional side view of device 10 of FIG. 31 taken along line 91 of FIG. 30 and viewed in direction 93 in an arrangement in which display 14 has been attached to members 12M2. This allows display 14 to flex as display 14 travels from rear face R to front face F of device 10 while sliding of portion 12-2 away from portion 12-1 for display expansion. Display 14 (in this example) covers all of front face F and curved sidewall W and part of rear face R of device 10 when display 14, device 10, and housing 12 are unexpanded as shown in FIG. 31. When expanded, display 14 slides to the front of device 10 in direction 96 in response to movement of portion 12-2 in direction 52, allowing the size of display 14 to be enlarged for viewing by a user such as user 98 who is viewing device 10 in direction 100 (e.g., display 14 is placed in an expanded viewable area configuration). If desired, larger portions of display 14 may overlap rear face R when display 14 is unexpanded or smaller portions of display 14 may be present on front face F and curved sidewall W without being present on rear face R when display 14 is unexpanded.

If desired, separate display panels may be used to form display 14 in a device with a sliding housing. A cross-sectional view of device 10 viewed along longitudinal axis 56 in an arrangement in which display 14 has overlapping and engaging sliding display portions is shown in FIG. 32. As shown in FIG. 32, device housing 12 may have first portion 12-1 and second portion 12-2. First portion 12-1 and/or second portion 12-2 may have interior portions that contain control circuitry, input-output devices, batteries, and other electrical components. Portions 12-1 and 12-2 may have slidable engagement structures. The engagement structures may be formed from overlapping and gripping sidewall structures in portion 12-2 that overlap the sidewalls of portion 12-1 and that hold portions 12-1 and 12-2 together while allowing portions 12-1 and 12-2 to slide with respect to each other along longitudinal axis 56. Portions 12-1 and 12-2 may be electrically connected using flexible circuits, wires, sliding electrical contacts, wireless communications, and/or other communications path arrangements that allow circuitry in portions 12-1 and 12-2 to interact while permitting sliding motion between portions 12-1 and 12-2. In some configurations, circuitry in portions 12-1 and 12-2 may operate without communicating with each other.

Display 14 may have a lower portion such as portion 14B (e.g., a first display portion or first display) that is coupled to the front face of housing portion 12-1 and may have an upper portion such as portion 14T that is coupled to the front face of housing portion 12-2. When in the unexpanded state of FIG. 33, display portion 14T is viewable to a user and display portion 14B is not visible due to the overlap of portion 14B by portion 14T. When in the expanded state of FIG. 34 (e.g., after portion 12-2 has been slid away from portion 12-1 in direction 52), both display portion 14T and display portion 14B of display 14 are viewable by the user on the front face of device 10. This offers the user of device 10 an enlarged viewing area. If desired, the presentation of content on portions 14B and 14T can be coordinated so that display portions 14B and 14T operate as a seamless unitary display surface. Configurations in which display portions 14B and 14T display separate images that do not mate with each other along the seam between portions 14B and 14T may also be used.

As described above, one aspect of the present technology is the gathering and use of information such as sensor information (e.g., optical sensor information). The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, eyeglasses prescription, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data.

The foregoing is illustrative and various modifications can be made to the described embodiments. The foregoing embodiments may be implemented individually or in any combination.

What is claimed is:

1. An electronic device, comprising:
   a housing configured to move between an expanded state and an unexpanded state;
   a first series of elongated members coupled to the housing;
   a second series of elongated members interdigitated with the first series of elongated members, wherein the second series of elongated members have protrusions that retain the first series of elongated members when the housing moves between the expanded state and the unexpanded state; and
   a flexible display that is movable between an expanded viewable area configuration when the housing is in the expanded state and an unexpanded viewable area configuration when the housing is in the unexpanded state.

2. The electronic device defined in claim 1 wherein a first end of the housing moves toward a second end of the housing in a first direction when the housing moves from the expanded state to the unexpanded state and wherein the protrusions extend from the second series of elongated members in a second direction that is different from the first direction.

3. The electronic device defined in claim 2 wherein the second direction is normal to the first direction.

4. The electronic device defined in claim 1 further comprising:
   a roller in the housing, wherein the flexible display bends around the roller when the display is in the unexpanded viewable area configuration.

5. The electronic device defined in claim 4 further comprising:
   a tensioner coupled between the flexible display and the housing.

6. The electronic device defined in claim 5 wherein the tensioner comprises a flexible member coupled to the flexible display and an additional roller.

7. The electronic device defined in claim 6 wherein the flexible member wraps around the additional roller when the flexible display is in the unexpanded viewable area configuration.

8. The electronic device defined in claim 1 further comprising:
   first and second pairs of nesting members, wherein the first and second series of elongated members are interposed between the first pair of nesting members and the second pair of nesting members.

9. The electronic device defined in claim 8 wherein the first and second pairs of nesting members telescope when the housing moves between the expanded state and the unexpanded state.

10. The electronic device defined in claim 1 further comprising:
    a sensor, wherein the first series of elongated members are separated by recesses that receive the second series of elongated members and wherein one of the recesses overlaps the sensor.

11. An electronic device, comprising:
    a flexible display configured to move between a first configuration with an expanded viewable area and a second configuration with an unexpanded viewable area;
    first and second housing portions configured to slide relative to each other as the flexible display moves between the first and second configurations;
    a support structure coupled to the first housing portion and overlapped by the flexible display, wherein the support structure comprises a first series of elongated members coupled to the housing and a second series of elongated members interdigitated with the first series of elongated members;
    a first set of nesting members interposed between the first and second housing portions; and
    a second set of nesting members interposed between the first and second housing portions, wherein the support structure is interposed between the first and second sets of nesting members.

12. The electronic device defined in claim 11 wherein the nesting members extend along first and second opposing sides of the electronic device.

13. The electronic device defined in claim 12 wherein the nesting members telescope as the flexible display moves between the first and second configurations.

14. The electronic device defined in claim 11 wherein the support structure supports the flexible display in the first and second configurations.

15. The electronic device defined in claim 14 further comprising:
    an additional support structure, wherein the support structure has protrusions and the additional support structure has recesses that retain the protrusions when the first and second housing portions slide relative to each other.

16. The electronic device defined in claim 15 wherein the protrusions are T-shaped.

17. The electronic device defined in claim 11 further comprising:
    a tensioner coupled to first housing portion, wherein the tensioner comprises a flexible member and a roller.

18. An electronic device, comprising:
    a flexible display having a first portion and a second portion;
    a housing having first and second sets of interdigitated members configured to move between expanded and unexpanded configurations, wherein the first interdigitated members have protrusions and the second interdigitated members have recesses that receive the protrusions, wherein in the expanded configuration the first and second portions face in a first direction and wherein the in the unexpanded configuration the first portion faces the first direction and the second portion faces a second direction that is different from the first direction; and a tensioner coupled to the housing, wherein the tensioner comprises a flexible member and a roller.

19. The electronic device defined in claim 18 further comprising:

a flexible support structure that supports the flexible display and that moves with the second portion when the housing moves between the expanded configuration and the unexpanded configuration.

20. The electronic device defined in claim 19 wherein the flexible support structure comprises linked segments.

* * * * *